United States Patent
Huang

(10) Patent No.: US 7,202,663 B2
(45) Date of Patent: Apr. 10, 2007

(54) METHOD FOR GENERATING FAST MAGNETIC RESONANCE IMAGES

(75) Inventor: Feng Huang, Gainesville, FL (US)

(73) Assignee: Iovivo Corporation, Gainesville, FL (US)

( * ) Notice: Subject to any disclaimer, the term of this patent is extended or adjusted under 35 U.S.C. 154(b) by 349 days.

(21) Appl. No.: 10/987,038

(22) Filed: Nov. 12, 2004

(65) Prior Publication Data

US 2005/0100202 A1    May 12, 2005

Related U.S. Application Data

(60) Provisional application No. 60/519,320, filed on Nov. 12, 2003.

(51) Int. Cl.
*G01V 3/00* (2006.01)

(52) U.S. Cl. ...................................... 324/307; 324/309

(58) Field of Classification Search ................ 324/307, 324/309, 318, 319, 321, 322, 300; 600/410–424
See application file for complete search history.

(56) References Cited

U.S. PATENT DOCUMENTS

| | | | |
|---|---|---|---|
| 5,474,067 A | | 12/1995 | Laub |
| 5,579,185 A | * | 11/1996 | Tsai et al. ................. 360/73.06 |
| 6,448,771 B1 | | 9/2002 | Harvey et al. |
| 6,518,760 B2 | | 2/2003 | Fuderer et al. |
| 6,600,944 B2 | | 7/2003 | Van Den Brink |
| 6,915,488 B2 | * | 7/2005 | Omori et al. ................. 715/773 |
| 7,053,613 B2 | * | 5/2006 | Lin ............................. 324/307 |

FOREIGN PATENT DOCUMENTS

| | | |
|---|---|---|
| WO | WO 03/096047 A1 | 11/2003 |
| WO | WO 03/096049 A1 | 11/2003 |

OTHER PUBLICATIONS

Kholmovskil, E.G.,et al. "Pocsense: POCS-based Reconstruction Method for Sensitivity Encoded Data" *Proc. Intl. Soc. Mag. Reson. Med.*, 2002; p. 194, vol. 10, Honululu,Hawaii, USA.

Samsonov, A. A., et al. "Method for Quality Improvement of Images Reconstructed From Sensitivity Encoded Data", *Proc. Int.1 Soc. Mag. Reson. Med.*, 2002, p. 2408, vol. 10, Honululu, Hawaii, USA.

Samsonov, A. A. et al. "A Modified POCSENSE Technique for Accelerated Iterative Reconstruction from Sensitivity Encoded MRI Data" *Proc. Intl. Soc. Mag. Reson. Med.*, 2003; p. 2343, Toronto, Canada.

Samsonov, A., et al. "Phase-Constrained Reconstruction of Sensitivity-Encoded MRI Data with POCSENSE", *Proc. Intl. Soc. Mag. Reson. Med.*, 2004; p. 2647, vol. 11, Koyoto, Japan.

(Continued)

*Primary Examiner*—Brij B. Shrivastav
(74) *Attorney, Agent, or Firm*—Saliwanchik, Lloyd & Saliwanchik

(57) ABSTRACT

The subject invention pertains to a method for acquiring and reconstructing a collection of time crucial magnetic resonance images. The subject invention is applicable for speeding up acquisition of or improving the quality of the set of images. In one specific embodiment, the subject method is used to reduce the time required to generate a cardiac CINE sequence of phases of the heart.

23 Claims, 9 Drawing Sheets

OTHER PUBLICATIONS

Samsonov A., et al. "Non-Cartesian POCSENSE", *Proc. Intl. Soc. Mag. Reson. Med.*, 2004; p. 2648, vol. 11, Koyoto, Japan.

Lee, J., et al. "Partial k-Space Reconstruction for Under-Sampled Variable-Density Spiral Tajectories", *Proc. Intl. Soc. Mag. Reson. Med.*, 2003; p. 475. vol. 11, Toronto, Canada.

Moriguchi, H., et al. "Partial Fourier Reconstruction for Spiral Imaging", *Proc. Intl. Soc. Mag. Reson. Med.*, 2003; p. 1064, vol. 11, Toronto, Canada.

Lee, K. J., et al. "Filtered backprojection, regridding, and POCS correction in projection reconstruction", *Proc. Intl. Soc. Mag. Reson. Med.*, 2004; p. 634, vol. 11, Koyoto, Japan.

Lee, K. J., et al. "Image-based ghost reduction of amplitude discontinuities in k-space with projections onto convex sets (POCS)", *Proc. Intl. Soc. Mag. Reson. Med.*, 2004; p. 2198, vol. 11, Koyoto, Japan.

Chang, Z., et al. "Scan Time Reduction with Gradient Energy Minimization (GEM) and Projection onto Convex Sets (POCS)", *Proc. Intl. Soc. Mag. Reson. Med.*, 2004; p. 2676, vol. 11, Koyoto, Japan.

Pruessmann, K., P. et al. "SENSE: Sensitivity encoding for fast MRI" Mag. Reson. Med., 1999, pp. 952-962, vol. 42.

Ra, J. B., et al. "Fast imaging using subencoding data sets from multiple detectors", *Mag. Reson. Med.*, 1993; pp. 142-145, vol. 30.

Sodickson, D.K., et al. "Simultaneous acquisition of spatial harmoni (SMASH): ultra-fast imaging with radiofrequency coil arrays", *Magn. Reson. Med.*, 1997: pp. 591-603, vol. 38.

Heidemann, R. M., et al. "VD-AUTO-SMASH imaging" *Mag. Reson. Med.*, 2001, pp. 1066-1074, vol. 45.

Griswold, M. A., et al. "Generalized Autocalibrating Partially Parallel Acquisitions (GRAPPA). Magnetic Resonance in Medicine", *Mag. Reson. Med.*, 2002; pp. 1202-1210, vol. 47.

Huang, F., et al. "Linear Interpolation in K-space", *Intl. Soc. Mag. Reson. Med.*, 2004; p. 2139, vol. 12, Kyoto.

Suga, M., et al. "Keyhole Method for High-Speed Human Cardiac Cine MR Imaging" *J. Mag. Reson. Imag.* 1999; pp. 778-783, vol. 10.

Tsao, J., et al. "Unifying Linear Prior-Information-Driven Methods for Accelerated Image Acquisition" *Mag. Reson. Med.*, 2001, pp. 652-660, vol. 46.

Katscher, U., "Underdetermined variable density SENSE"—*Intl. Soc. Mag. Reson. Med.*, 2003; p. 2342, vol. 11, Toronto.

Liang, Z., et al. "Parallel Generalized Series Imaging" *Intl. Soc. Mag. Reson. Med.*, 2003; p. 2341, vol. 11, Toronto.

Wang, J. et al. "Parallel Acquisition Techniques with Modified Sense Reconstruction mSense", *First Wurzburg workshop on: Parallel Imaging Basics and Clinical Applications*, 2001; p. 92, Wurzburg, Germany.

McKenzie, C.A., et al. "Self-Calibrating Parallel Imaging With Automatic Coil Sensitivity Extraction", *Magnetic Resonance in Medicine*, 2002; pp. 529-538, vol. 47.

Tsao, J., et al. "k-t BLAST and k-t SENSE: Dynamic MRI with High Frame RAte Exploiting Spatiotemporal Correlations", *Magnetic Resonance in Medicine*, 2003; pp. 1031-1042, vol. 50.

Huang, F., et al. "k-t GRAPPA" *The 2nd parallel imaging workshop*, 2004, p. 53, Zurich, Germany.

Moriguchi, H., et al. "A New Approach of Optimal Reconstruction Using Rescaled Matrices form Non-uniformly Sampled K-Space Data", *Proc. Intl. Soc. Mag. Reson. Med.*, 2003, p. 1066, vol. 11.

Rasche, V.,et al. "Resampling of Data Between Arbitrary Grids Using Convolution Inerpolation", *IEEE Trans. Med Imag.*, 1999, pp. 385-392, vol. 18, No. 5.

Pruessmann, K. P., et al. "Advances in Sensitivity Encoding With Arbitrary k-Space Trajectories", *Magnetic Resonance in Medicine*, 2001, pp. 638-651, vol. 46.

Samsonov, A. A. et al. "Image Reconstruction from Sensitivity Encoded MRI Data Using Extrapolated Iterations of Parallel Projections onto Convex Sets" *Medical Imaging*, 2003, pp. 1829-1838, vol. 5032.

Tsao, J. et al. "Prior-information-enhanced Dynamic Imaging using Single or Multiple Coils with k-t BLAST and k-t SENSE" *Proc. Intl. Soc. Mag. Reson. Med.*, 2002, p. 1, vol. 10.

Tsao, J. et al. "Unifying Linear Prior-Information-Driven Methods for Accelerated Image Acquisition" *Magnetic Resonance in Medicine*, 2001, p. 652-660, vol. 46.

* cited by examiner

FIG. 4A  FIG. 4B
FIG. 4C  FIG. 4D

METHOD FOR GENERATING FAST MAGNETIC RESONANCE IMAGES

CROSS-REFERENCE TO RELATED APPLICATION

This application claims the benefit of provisional patent application Ser. No. 60/519,320, filed Nov. 12, 2003, which is hereby incorporated by reference in its entirety.

FIELD OF THE INVENTION

The subject invention is an image reconstruction technique that can be utilized in, for example, the field of magnetic resonance imaging (MRI), where partial or non-Cartesian k-space is acquired for the purpose of fast imaging.

BACKGROUND OF THE INVENTION

Scan time is crucial in some applications, such as Cardiac MR and Functional MR. Projection on convex sets (POCS), parallel imaging techniques, and k-t space based reconstruction techniques are independent sets of methods to reduce MRI acquisition time, i.e. by reducing the amount of acquired data in k-space. It is possible to combine one or more of these sets of techniques together.

Recently, some projection on convex sets (POCS) based reconstruction methods have been introduced. These methods can offer a straightforward and computationally efficient way to incorporate non-linear constraints into the reconstruction, which can lead to improved image quality and/or reliable reconstruction for underdetermined problems. Kholmovskil and Samsonov et al. proposed a set of POCS based methods (1–5) for reconstruction with the data for parallel imaging. This set of methods can be referred to as POC-SENSE. In these methods, besides partial k-space and sensitivity maps, image support and/or the image phase, which is obtained either from other references or smoothness of initial reconstruction, are utilized as input. POCS is also widely used for non-Cartesian trajectory reconstruction. J. Lee et al. (6) and Moriguchi et al. (7) proposed an application for under-sampled variable-density spiral trajectories. K. J. Lee et al. applied POCS on radial trajectory (8) and spin-echo EPI (9). Chang and Xiang (10) introduced a hybrid method of Gradient Energy Minimization (GEM) and POCS to reconstruct high quality images with partial k-space but without using phased array coil.

Parallel imaging techniques using multiple coils have become increasingly important since the late 1980's due to higher signal to noise ratios (compared to volume coils or large surface coils) and reduced MRI acquisition time. Some techniques require coil sensitivity maps, such as sensitivity encoding (SENSE) (11), sub-encoding (12) and simultaneous acquisition of spatial harmonics (SMASH)(13). SENSE provides an optimized reconstruction whenever a perfectly accurate coil sensitivity map can be obtained. However, there are some cases where the acquired sensitivity maps contain significant errors. For example, patient motion, including respiratory motion, can lead to substantial errors in acquired sensitivity maps, particularly at the coil edges where the coil sensitivity changes rapidly. Any errors contained in these maps will propagate into the final image during SENSE reconstruction and may also result in decreased signal-to-noise ratios. In such cases, methods utilizing interpolation of k-space data without the use of sensitivity maps might be a better choice.

VD-AUTO-SMASH (14), Generalized Auto calibrating Partially Parallel Acquisitions (GRAPPA) (15), and linear interpolation in k-space (16) are examples of methods that do not use sensitivity maps. Both VD-AUTO-SMASH and GRAPPA use weighted linear combinations and extra k-space lines to interpolate missing k-space data. The extra lines are known as auto-calibration signal lines (ACS lines) and are used to generate the weights used in the linear combinations. VD-AUTO-SMASH interpolates the composite k-space, while GRAPPA interpolates the k-space of individual coils. Some of the drawbacks of VD-AUTO-SMASH are described in detail in reference (15).

Methods of generating images using k-t space based reconstruction techniques can be applied to dynamic imaging. These techniques exploit the temporal correlations among a sequence of images. Such methods include, for example, keyhole (Suga, Mikio, TM Masaru Komori, Kotaro Minato, Takashi Takahashi (1999), "Keyhole Method for High-Speed Human Cardiac Cine MR Imaging", *Journal of Magnetic Resonance Imaging*, 10:778–783 (17–19), continuous update with random encoding (CURE), reduced field of view (FOV), and broad-use linear acquisition speed-up technique (BLAST) (Tsao, Jeffrey, Behnia, Babak, Tsao B B, Andrew G. Webb (2001), "Unifying Linear Prior-Information-Driven Methods for Accelerated Image Acquisition", *Magn. Reson. Med.*, 46:652–660) (20). These methods use the prior information in k-space, which often leads to an artificial view of dynamic area. Underdetermined variable density SENSE (Katscher, U. (2003), "Underdetermined variable density SENSE", ISMRM, Toronto. p 2342 (21) uses a pre-scan low resolution image as prior information. This method is more general because it can be used for other than dynamic MRI. However, due to the minimization computation and intensity correction for prior information complexity, this method can be considerably time-consuming. Parallel Generalized Series Imaging uses a prior-information-driven method to generate an approximated reconstruction image for a more accurate sensitivity map, and then applies this sensitivity map and a generalized SENSE method to produce a better reconstruction (Liang, et al. (22,23)). In contrast to the disclosure of U.S. Pat. No. 6,448,771 and the teachings of Tsao et al. (Tsao, Jeffrey, Behnia, Babak, Tsao B B, Andrew G. Webb (2001), "Unifying Linear Prior-Information-Driven Methods for Accelerated Image Acquisition", *Magn. Reson. Med.*, 46:652–660), which copy the prior k-space, and in contrast to (Katscher, U. (2003), "Underdetermined variable density SENSE", ISMRM, Toronto. p 2342 (21)), which works in image space, the subject method for generating dynamic magnetic resonance images can use the prior information in image space to calibrate the unsampled k-space data.

These strategies are able to reduce data acquisition without compromising image quality significantly because typical images exhibit a high degree of spatial and/or temporal correlations, either by nature or by design. Therefore, there is a certain amount of redundancy within the data. Each of these techniques exploits the correlations in certain ways and can generate high quality images. However, each of these techniques also has drawbacks.

Parallel imaging techniques using multiple coils have become increasingly important since the late 1980's due to higher signal to noise ratios (compared to volume coils or large surface coils) and reduced MRI acquisition time. However, both image-space-based methods (SENSE) and k-space based methods (GRAPPA) only exploit spatial correlations. Methods utilizing k-t-t space based reconstruction techniques take advantage of the temporal correlations, but do not take advantage of the spatial correlations when multi-channel coils are available. K-t space parallel imaging techniques can utilize both spatial and temporal correlations. However, because of the linearity of the existing methods, k-t space parallel imaging techniques cannot utilize non-linear constraints. POCS methods have the advantage that they offer a straightforward and computationally efficient way to incorporate non-linear constraints into the reconstruction that can lead to improved image quality and/or reliable reconstruction for underdetermined problems. Nevertheless the existing POCS based methods do not explicitly exploit either the spatial or temporal correlation.

Hence, there is a need in the art for a method that can combine the benefits of the POCS method with the benefits of parallel imaging and/or the benefits of k-t space reconstruction.

BRIEF SUMMARY OF THE INVENTION

The subject invention pertains to methods and apparatus for acquiring and reconstructing a set of time crucial MRI images. The set of images may be spread through time, as in an enhancement study or interventional MRI, where some region of the image is changing relatively little through time. The set of images may represent periodic motion, as in the phases of a cardiac cycle. Alternatively, a set of 2D images may be stacked, where the images appear similar from slice to slice. The subject invention is applicable for speeding up acquisition of and/or improving the quality of the set of images. In one specific embodiment, the subject method is used to reduce the time required to generate a cardiac CINE sequence of phases of the heart.

In an embodiment, the subject method combines POCS with parallel imaging and/or k-t space reconstruction to improve the quality of the reconstructed image. In specific embodiments, the subject method can combine POCS with dynamic imaging, self-calibrating SENSE, SENSE/GRAPPA for dynamic imaging, parallel imaging, and/or parallel imaging with multiple channels. Reference 11, Pruessmann K. P., Weiger M., Scheidegger M. B., Boesiger P. SENSE: Sensitivity encoding for fast MRI. Magn Reson Med 1999; 42:p 952–962, is incorporated by reference in its entirety and teaches SENSE. Reference 15, Griswold M. A., Jakob P. M., Heidemann R. M., Mathias Nittka, Jellus V., Wang J., Kiefer B., Haase A. Generalized Autocalibrating Partially Parallel Acquisitions (GRAPPA). Magnetic Resonance in Medicine 2002; 47: p 1202–1210, is incorporated by reference in its entirety and teaches GRAPPA.

The subject method can use any available information (linear or non-linear) in reconstruction. The subject method can exploit spatial and/or temporal correlations among acquired data and can directly utilize all acquired data and any prior information in reconstruction. The subject method can use less measured information to generate high quality MR images in a shorter time. In an embodiment, the subject method can incorporate the following: first, apply parallel imaging and/or dynamic imaging to reconstruct an initial image; second, apply the available constraint in image space to improve the image; third, apply fast Fourier transform, and the coil sensitivity information in case of multichannels, to project the result back into k-space and utilize all constraints in k-space to improve the k-space data; and fourth, reconstruct the image again based on the improved k-space data through parallel imaging and/or dynamic imaging techniques. When necessary, these steps can be repeated until the reconstructed image is good enough and/or convergent. The following sections discussion several specific embodiments of the subject invention. To generate sensitivity maps and improve SNR, a fully sampled center is preferred, although not necessary.

A specific embodiment of the subject method can produce a sequence of magnetic resonance imaging (MRI) images, by a. acquiring an acquired plurality of k-space data sets, wherein the acquired plurality of k-space data sets are acquired during a corresponding plurality of MRI scans taken over a corresponding plurality of time periods;

b. reconstructing a sequence of MRI images from the acquired plurality of k-space data sets, wherein each MRI image of the sequence of MRI images is reconstructed from a corresponding k-space data set of the plurality of k-space data sets;

c. applying a constraint to the sequence of MRI images in the image domain, wherein the constraint is applied to a portion of each MRI image that is slow-moving, wherein application of the constraint to the sequence of MRI images in the image domain modifies the sequence of MRI images;

d. projecting each of the modified sequence of MRI images into k-space to create a projected plurality of k-space data sets;

e. applying a fidelity operator to the projected plurality of k-space data sets, wherein the fidelity operator replaces at least a portion of the k-space data in the k-space data sets of the projected plurality of k-space data sets with the corresponding k-space data from the acquired plurality of k-space data sets, wherein the replacement of at least a portion of the k-space data in the projected plurality of k-space data sets further modifies the projected plurality of k-space data sets; and f. reconstructing an output sequence of MRI images from the modified projected plurality of k-space data sets. With respect to this method including steps a through f, reference can be made to FIG. 8. The flowchart of FIG. 8 starts at the top of FIG. 8 and goes down, with each step a through f shown as the data is transformed between image space and k-space.

In a specific embodiment, a second constraint can be applied to the modified plurality of k-space data sets in k-space, wherein application of the second constraint to the modified plurality of k-space data sets in k-space further modifies the modified plurality of k-space data sets. The second constraint can be, for example, a low-pass filter.

In a further specific embodiment, steps c through f described above can be repeated such that:

g. the constraint is applied to the output sequence of MRI images in the image domain, wherein the constraint is applied to a portion of each MRI image that is slow-moving, wherein application of the constraint to the output sequence of MRI images in the image domain modifies the output sequence of images;

h. each of the modified output sequence of MRI images is projected into k-space to create an additional projected plurality of k-space data sets;

i. the fidelity operator is applied to the additional projected plurality of k-space data sets, wherein the fidelity operator replaces at least a portion of the k-space data in the k-space data sets of the additional projected plurality of k-space data set with the corresponding k-space data from the acquired plurality of k-space data sets, where the replacement of at least a portion of the k-space data in the additional projected plurality of k-space data sets modifies the additional projected plurality of k-space data sets; and j. the output sequence of MRI images is reconstructed from the modified additional projected plurality of k-space data sets.

With respect to this embodiment with the repetition of steps c through f, given as steps g through j, reference can be made to FIG. 9. The flowchart of FIG. 9 shows the feedback loop of repeating steps c through f, described as steps g through j. Another way of showing or describing the same algorithm would be to show the feedback occurring prior to the reconstruction of the output sequence and entering back just prior to the reconstruction of the sequence of MRI images. In this way, the feedback would show on the k-space side of FIG. 9 rather than the image space side.

Reference can also be made to FIG. 6, which shows a flowchart for reconstructing an image, as part of a sequence of images, in accordance with an embodiment of the subject invention. Rather than proceeding from step 1 to step 7, steps 2 through 6 can be added. A specific embodiment could proceed from step 2 to step 4, if the constraint to be applied in FIG. 4 is known. In a specific embodiment, step 3 can be utilized. Step 1 is acquiring an original acquisition time sequence of k-space data sets. Step 2 is reconstructing a sequence of images from the time sequence of k-space data sets, where each k-space data set corresponds to an image in the sequence of images. Step 3 involves producing a dynamic level map from the sequence of images where the dynamic level map has a value for each pixel corresponding to how dynamic the pixel is over the sequence of images. In an embodiment, this value relating to how dynamic the pixel can be the standard deviation of the values of the pixel over the sequence of images. Other values relating to how dynamic the pixel is can also be used. The dynamic region, or fast-moving region, can then be determined by selecting pixels having a value relating to how dynamic the pixel is over the sequence of images over a certain threshold. Other algorithms for selecting the dynamic region can be implemented in accordance with the subject invention.

Once the fast-moving region, and therefore the slow-moving region, is determined, an average of each pixel in the slow-moving region can be determined and used to create a constraint. The constraint can vary and, in an embodiment, is implemented in step 4 by replacing the pixel values in the slow-moving region with the average value of the pixels over the sequence of images, or other value determined. Examples of other values that can be used for this purpose include the values in the slow-moving region of an additional image created from, for example, a full k-space scan or the values in the slow-moving region of one of the images. FIG. 7 shows an image from a sequence of images having regions that are high dynamic and regions that are low dynamic, along with a representation of the standard deviation along the time direction for the sequence of images for each pixel. Step 4 then involves applying the constraint. Step 5 is projecting the images back into k-space through, for example, the FFT. In step 6, a fidelity operator can be applied by replacing the k-space value of the k-space positions for position having acquired k-space data. Not all positions will have acquired k-space data as less than a full k-space scan was conducted. In this way, the acquired k-space data used to replace the current k-space at each position improves the accuracy of the data. Step 7 is the reconstruction of the output sequence of images from the d-space data sets. As discussed before, steps 4–7 can be repeated until convergence and/or a desired output.

The steps g, h, i, and j can be repeated until the output sequence of images are convergent and/or meet a desired standard. The output sequence of images can be determined convergent when the step of applying the constraint to the output sequence of images does not change the output sequence of images more than a first threshold amount. Other techniques can also be used, such as the output sequence of images can be determined convergent when the step of applying the fidelity operator to the additional projected plurality set of k-space data sets does not change the additional projected plurality of k-space data sets more than a second threshold amount.

The fidelity operator can replace the k-space data in the k-space data sets of the modified plurality of k-space data sets having corresponding k-space data in the acquired plurality of k-space data sets with the corresponding k-space data in the acquired plurality of k-space data sets.

An additional acquired k-space data set can be acquired, wherein the additional acquired k-space data set is acquired during a corresponding additional MRI scan taken over a corresponding additional time period, wherein the additional acquired k-space data set is more complete than each of the acquired k-space data sets of the acquired plurality of k-space data sets, wherein the constraint is derived from the additional acquired k-space data set. An additional MRI image can be reconstructed from the additional acquired k-space data set, wherein applying the constraint can involve setting a portion of each MRI image of the sequence of MRI images that is low-moving equal to a corresponding portion of the additional MRI image reconstructed from the additional acquired k-space data set. In an embodiment, prior to step c, each MRI image in the sequence of MRI images can be segmented into a slow-moving portion of the MRI image and a fast-moving portion of the MRI image. Segmenting each image into a slow-moving portion of the MRI image and a fast-moving port of the MRI image can involve calculating a variance of the values of each pixel location from the sequence of MRI images reconstructed from the acquired plurality of k-space data sets and assigning each pixel having a variance below a threshold value to the slow-moving portion of the MRI image and assigning each pixel having a variance above the threshold value to the fast-moving port of the MRI image. Other techniques to segment the MRI images can also be used. For example, segmenting each MRI image in the sequence of MRI into a slow-moving portion of the MRI image and a fast-moving portion of the MRI image can involve a user selecting the slow-moving portion of the MRI image and the fast-moving port of the MRI image. This selection can be made after a visual inspection of the sequence of images to select the dynamic portions of the image. Other techniques for selecting the fast-moving portion of the images can also be used.

In an embodiment, each of the k-space data sets of the acquired plurality of k-space data sets acquired during one of the corresponding plurality of MRI scans incorporates at least two k-space data sets, wherein each of the at least two k-space data sets are acquired by one of a corresponding at least two channels of a MRI system used to acquire the acquired plurality of k-space data sets. This can be referred to as parallel imaging. The data from the plurality of coils can be combined by known methods in the art. In this way, reconstructing a sequence of MRI images and reconstructing an output sequence of MRI images can involve reconstructing a sequence of MRI images via a parallel imaging technique and reconstructing an output sequence of MRI images via the parallel imaging technique. The parallel imaging technique can be GRAPPA. The parallel imaging technique can be SENSE. When the MRI system does not incorporate parallel imaging, reconstructing a sequence of MRI images and reconstructing an output sequence of MRI images can involve reconstructing a sequence of MRI images via a non-parallel imaging technique and reconstructing an output sequence of MRI images via the non-parallel imaging technique. Examples of such non-parallel imaging techniques include k-t GAAPPA, k-t BLAST, UNFOLD, or SLIDING WINDOW.

POCS with Dynamic Imaging

In a specific embodiment, the subject method can use prior background information for dynamic image reconstruction and can take advantage of the similarity of the background of a dynamic image. The subject method can acquire and reconstruct a plurality of magnetic resonance images, where fewer k-space samples are acquired than the total number of pixels in all the images, and where unsampled k-space points in individual images are computed using the constraint that a real-space subset of pixels is invariant or approximately invariant between two or more images in the collection. Information in a subset of pixels in an image can be used to determine unsampled k-space points in one or more additional images. In a specific embodiment one of the images can be fully acquired in k-space, and information in a subset of pixels in that image can be used to determine unsampled k-space points in all other images in the collection. In an additional embodiment, all images can be partially sampled, and the constraint that a subset of pixels in every image is the same for all images can be used to determine unsampled k-space points. Information from separate receiver channels can be used to help determine unsampled k-space points.

In a specific embodiment, the subject method can incorporate a pre-scan step, so as to take a full k-space scan to get a high-resolution image and choose the background. For all other time sequences for the same slice, k-space can be sparse and of any type. The background of the pre-scan can be used to calibrate the sparse k-space to generate a Full-Cartesian k-space for each channel. These Full Cartesian k-spaces can be applied to generate high quality images.

The background can be chosen in a variety of ways. For example, a human operator can mark a portion of an initial image of the region to be imaged as dynamic area of image, or foreground, with the remaining portion of the image being the background. In a specific embodiment for generating 256×256 pixel images, identifying the foreground and background involves identifying which pixels are in the foreground and which pixels are in the background. The foreground portion can be the portion of the initial image of the region to be imaged which is expected to vary significantly, where the background portion can be the portion of the initial image of the region to be imaged which is not expected to vary significantly. The initial image can be a high-resolution image based on a full k-space scan. Such an initial image can be used as one of the series of images of the region of interest. Alternatively, a low resolution image can be taken to identify an object of interest such as the heart. In this case, the low resolution image may not be used as one of the series of images of the region of interest. Other images can be used as well for this initial image. Other techniques which can be used to choose the background include, but are not limited to, comparing two or more images of the region to be imaged to determine the differences between two or more images and choosing the background based on which portions of the two or more images do not vary significantly and/or utilizing computer software to choose the background based on an analysis of an image, or two or more images, of the region to be imaged. Accordingly, the background can be chosen based on information obtained prior to acquisition of the series of images and/or information obtained during acquisition of the series of images of the region of interest.

The subject method can be faster than prior techniques. In a specific embodiment, the subject method can be up to 60 times faster than SENSE for the same problem. Furthermore, the subject method can allow the processing for each channel to be independent, such that multiple processors can be applied. In this way the reconstruction can be in real-time. The subject method can be more accurate than prior techniques. In a specific embodiment, using the same data, the ghost ratio of the subject method is only 69% (statistically) of the result by SENSE and 46% (statistically) of the result by GRAPPA. The subject method can be more flexible then prior techniques. The subject method, in one or more specific embodiments, can be applied for any kind of k-space trajectories.

The subject method can be directly applied to cardiac MR and interventional MRI. Scan time can be much shorter and achieve even more accurate reconstructed images. In a specific embodiment, the use of the subject method can eliminate the necessity of gating for cardiac MR.

Generalized SENSE can solve the same problem but may need a much longer reconstruction time. Also, with generalized SENSE, an accurate sensitivity map is necessary and a complicated gridding technique is required for Non-Cartesian k-space. Compared to generalized SENSE, the subject method can use less, and often significantly less, reconstruction time and can generate more accurate results, without the need for a sensitivity map and without a complex gridding technique. Accordingly, the use of the subject method can increase productivity, accuracy and simplify the process.

GRAPPA only works for equally-spaced k-space. Modified GRAPPA only works for equally-angle-spaced radial k-space. The subject method, in one or more specific embodiments, can be utilized with any kind of k-space trajectory. In addition, with the same data, the subject method can be more accurate than GRAPPA, where in a specific embodiment the subject method is 2–3 times more accurate than GRAPPA. Time crucial applications often involve dynamic images, where a time series of images at the same slice are collected. These images of same slice are often very similar. Some areas of these images have no explicit change. Hence the information in early-collected image may be applied to reconstruct new images. Prior attempts have been made to take advantage of the prior information (Liang, (23) and Katscher, U. (2003), "Underdetermined variable density SENSE", ISMRM, Toronto. p 2342). However, these methods are only for Cartesian k-space and have long reconstruction times. The subject method can use the static information in image space to calibrate partially collected arbitrary distributed k-space data. In a specific embodiment, the subject method can take advantage of the high speed of the Fast Fourier Transform to efficiently generate high quality images POCS with Self-Calibrating SENSE SENSE is known as a reconstruction method in image space. Accuracy of sensitivity maps is essential for the reconstruction. Wang et al. (24) and McKenzie et al. (25) suggested to use fully-sampled k-space as internal sensitivity references to avoid inaccurate registration of sensitivity maps. However when the k-space is not equally spaced, a huge linear system needs to be solved for SENSE reconstruction. Hence SENSE either cannot directly utilize some of the acquired k-space data for reconstruction or cannot avoid computation complexity when a fully-sampled center is available. A simple way to utilize a fully acquired center for reconstruction is to project the reconstructed image by SENSE back into k-space, and then utilize all of the acquired data in k-space before reconstructing the final image through any optimized algorithm for phased array coil. A specific embodiment of the subject invention can combine the benefits of POCS with the benefits of a self-calibrating SENSE method. A specific embodiment of the subject method involves the following: first, calculate sensitivity maps based on a fully sampled center in k-space; second, reconstruct an image through SENSE; third, apply fast Fourier transform to project the pixel-wise multiplication of the reconstructed image and the corresponding sensitivity maps back into k-space and generate a set of full k-space data; fourth, use acquired data at all sampling positions where data was acquired instead of the generated value in the set of full k-space data; fifth, reconstruct an image based on the set of full k-space data through any optimized method for phased array coil, such as sum-of-squares.

POCS with SENSE/GRAPPA for Dynamic Imaging

In situations with more than one channel, the subject method can be easily combined k-t space reconstruction techniques with parallel imaging techniques and/or dynamic imaging to reduce the necessary acquisition time and/or improve the image quality. In another embodiment, the reconstruction method for dynamic imaging can be replaced with a parallel imaging reconstruction technique and then the same technique described above under "POCS with dynamic imaging" can be used. In another embodiment, variational density k-space data can be acquired, and GRAPPA can be applied to partially interpolate the k-space data and then use the method described above to interpolate the other k-space data. In a specific example, the number of phase encoding lines is 256; the reduction factor can be set to be 1 for central 10 lines [78 82], [123 132], which can be used as Auto Calibration Signal ACS lines; the reduction factor can be set to be 2 for lines [73 122] and [133 182]; and the reduction factor can be set to be 4 for other places. For reconstruction, GRAPPA is applied to generate fully sampled k-space data at lines [73 182], and then apply the technique described above under "POCS with dynamic imaging" to reconstruct the image.

Another specific embodiment incorporates a modified SENSE technique for dynamic imaging. In conventional SENSE, a linear system is solved to unwrap the folded image. Suppose the number of channels is $N_C$ and the reduction factor is R. Then a linear system, which has $N_C$ unknowns and R unknowns, needs to be solved to unwrap one pixel on the folded image. However, if some prior intensity information is available, then the number of unknowns can be reduced in the system, and hence reduce the number of required equations, or the g-factor. Consequently, the amount of data required to be acquired can be reduced and/or the SNR can be improved. For dynamic imaging, it is possible to generate this kind of prior intensity information as described above. Again, a fully sampled center is necessary for sensitivity maps and higher SNR. This technique is referred to as SENSE for dynamic imaging. In a specific embodiment of the subject invention, the method described above in the section entitled "POCS with dynamic imaging" can be combined with the SENSE technique for dynamic imaging. The method described above in the section entitled "POCS with dynamic imaging" can incorporate the following: first, apply SENSE for dynamic imaging to reconstruct a initial image; second, apply fast Fourier transform, and the coil sensitivity information in case of multichannels, to project the result back into k-space and utilize all constraints in k-space to improve the k-space data; and third, reconstruct the image again based on the improved k-space through sum-of-squares and use the prior intensity information to correct the reconstructed image. If desired, steps 2 and 3 can be repeated until the reconstructed image is good enough and/or convergent.

POCS for Parallel Imaging with Multiple-channel Coil

To improve image quality, a multiple-channel coil, such as a 32 channel cardiac coil (MRI Devices Corporation, Waukesha, Wis.) can be utilized. However, when the number of channels is large, reconstruction time for parallel imaging can be considerable. One way to address this problem is to compress the data into a fewer number of channels and then reconstruct the image. In many cases, some information can be lost in the step of data compression. In an embodiment of the subject invention, allowing utilization of all of the acquired data, the reconstructed image with compressed data can be projected back into the original uncompressed k-space and then another image can be reconstructed by an algorithm for phased array coils after the acquired k-space data is used to replace k-space values at the corresponding k-space positions of the acquired k-space data. Preferably such an algorithm for phased array coils can be optimized. A fully sampled center is preferred, and sometimes necessary, for sensitivity maps and higher SNR. An embodiment of the subject method can incorporate the following: first, apply parallel imaging and/or dynamic imaging on compressed data to reconstruct an initial image; second, apply fast Fourier transform, and the coil sensitivity information in case of multiple channels, to project the result back into original uncompressed k-space and utilize all acquired data in k-space; third, reconstruct the image again based on the improved uncompressed k-space data through sum-of-squares. In an embodiment utilizing fast Fourier transform in this operation, combining this operation with POCS will not significantly increase the reconstruction time much but can dramatically improve the image quality.

DETAILED DESCRIPTION OF THE FIGURES

FIGS. 4A–4D show results of a specific embodiment of the subject invention for cardiac image with 12.5% acquired data and four receiver channels with all images using the same gray scale, where FIG. 4A shows a reference of the $9^{th}$ image; FIG. 4B shows a reconstructed result of the $9^{th}$ image utilizing a specific embodiment of the subject method, where relative error is 10.56%; FIG. 4C shows a reconstructed result of the 9th image by keyhole, where relative error is 11.11% (the arrow shows the obvious error); FIG. 4D shows a reconstructed result of the 9th image utilizing a specific embodiment of the subject method which incorporates parallel imaging.

Figure 5A:
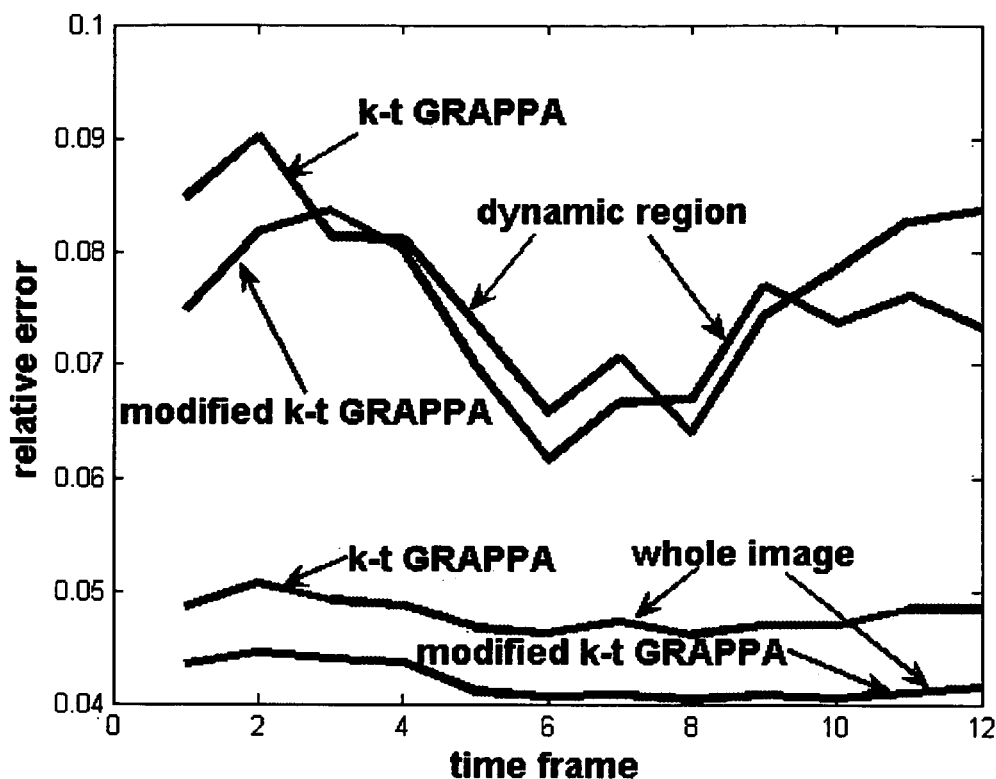

FIG. 5A shows relative errors of smoothly changing images for kt GRAPPA and modified kt GRAPPA, for data acquired utilizing a MRI Devices Corporation's 32-channel Cardiac coil.

Figure 5B:
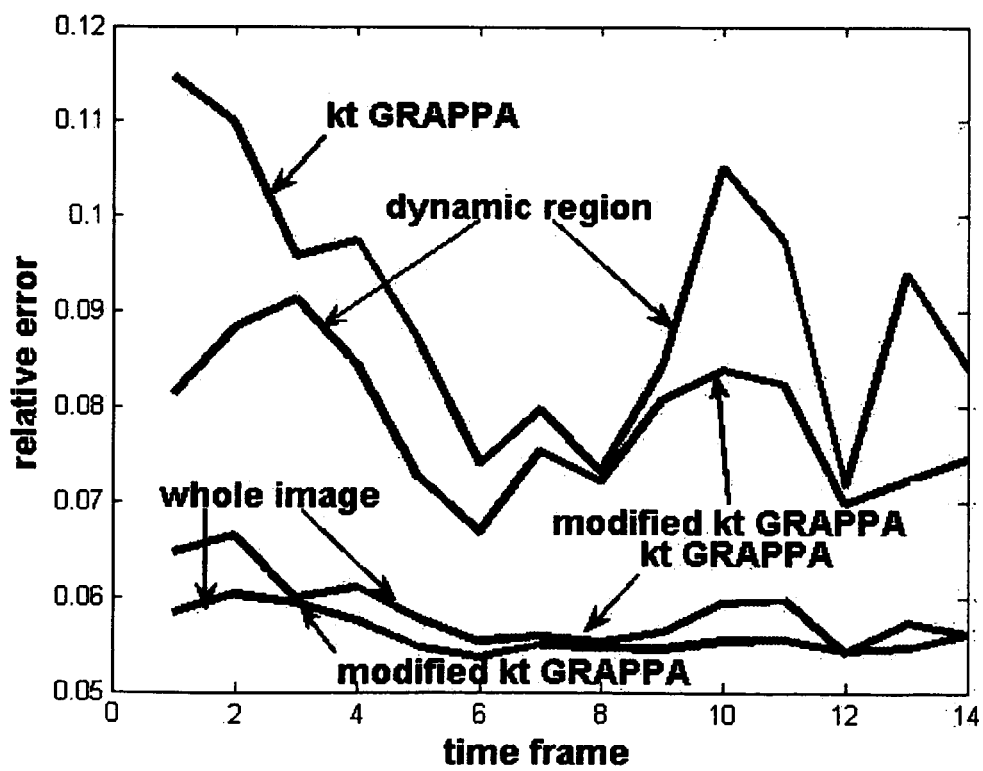

FIG. 5B shows relative errors of smoothly changing images for kt GRAPPA and modified kt GRAPPA, for data acquired utilizing a SIEMENS TIM12-channel Cardiac coil.

Figure 5C:
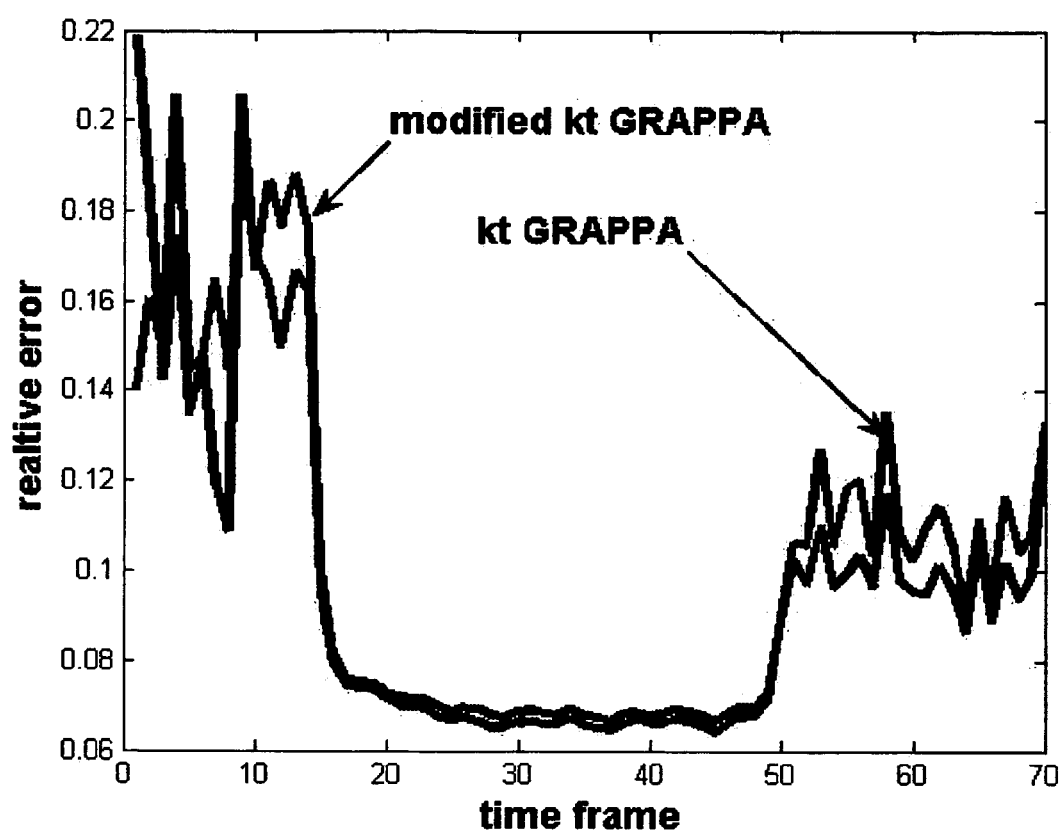

FIG. 5C shows relative errors of abruptly changing images for kt GRAPPA and modified kt GRAPPA, for data acquired utilizing a SIEMENS 8-channel Cardiac coil.

Figure 6:
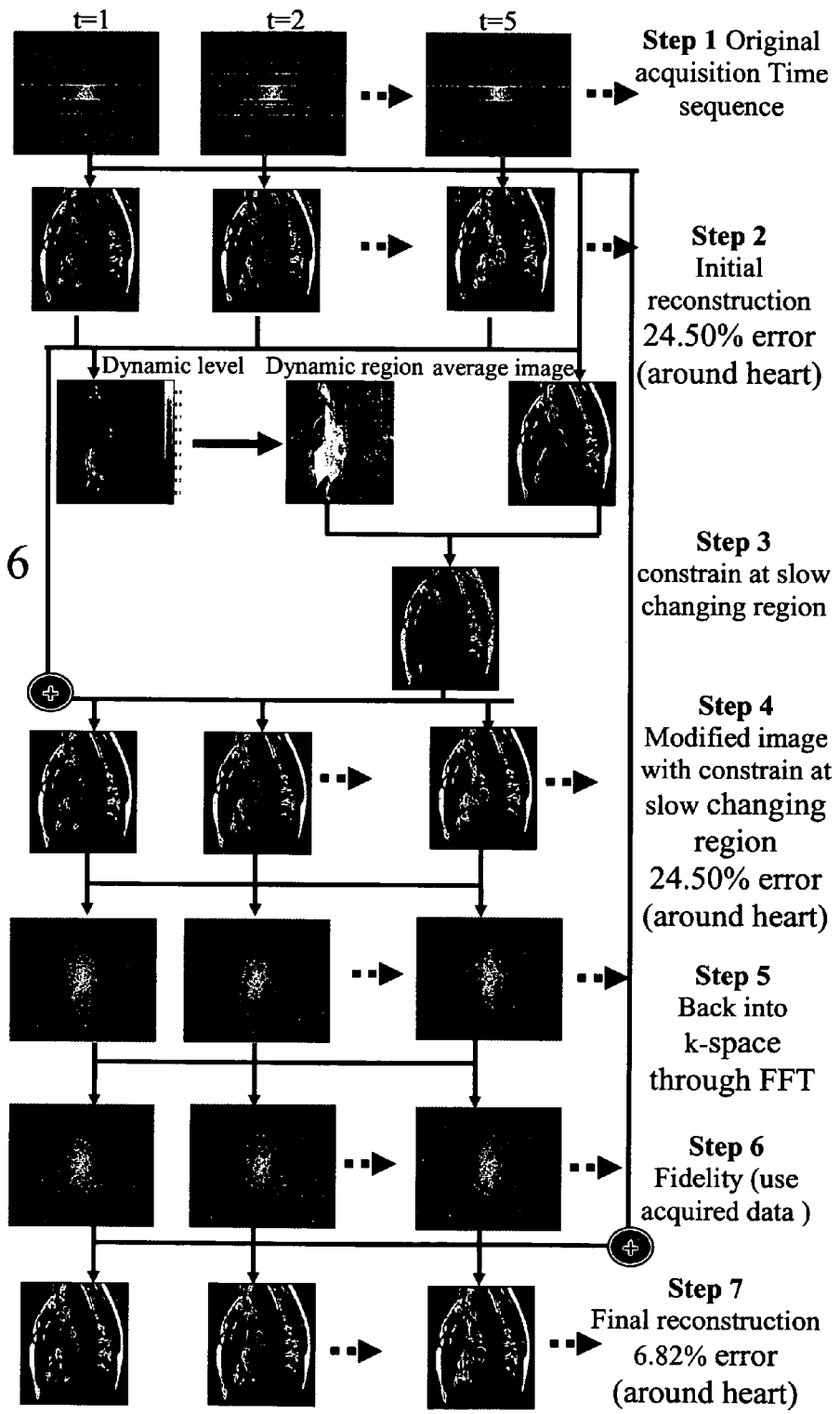

FIG. 6 shows a flow chart for reconstructing an MRI image in accordance with a specific embodiment of the subject invention.

Figure 7:
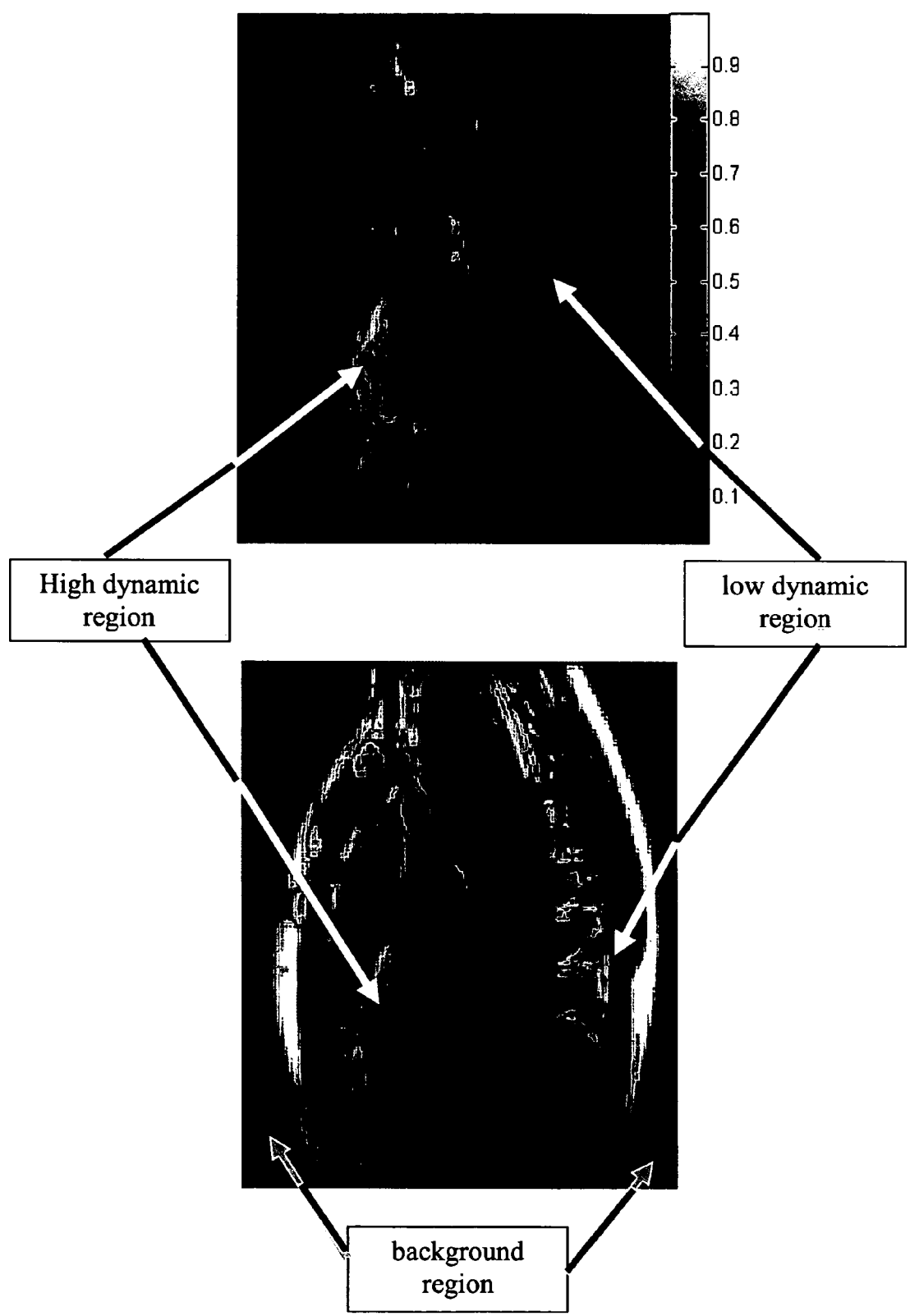

FIG. 7 shows an image from a sequence of images having regions that are high dynamic and regions that are low dynamic, along with a representation of the standard deviation along the time direction for the sequence of images for each pixel.

Figure 8:
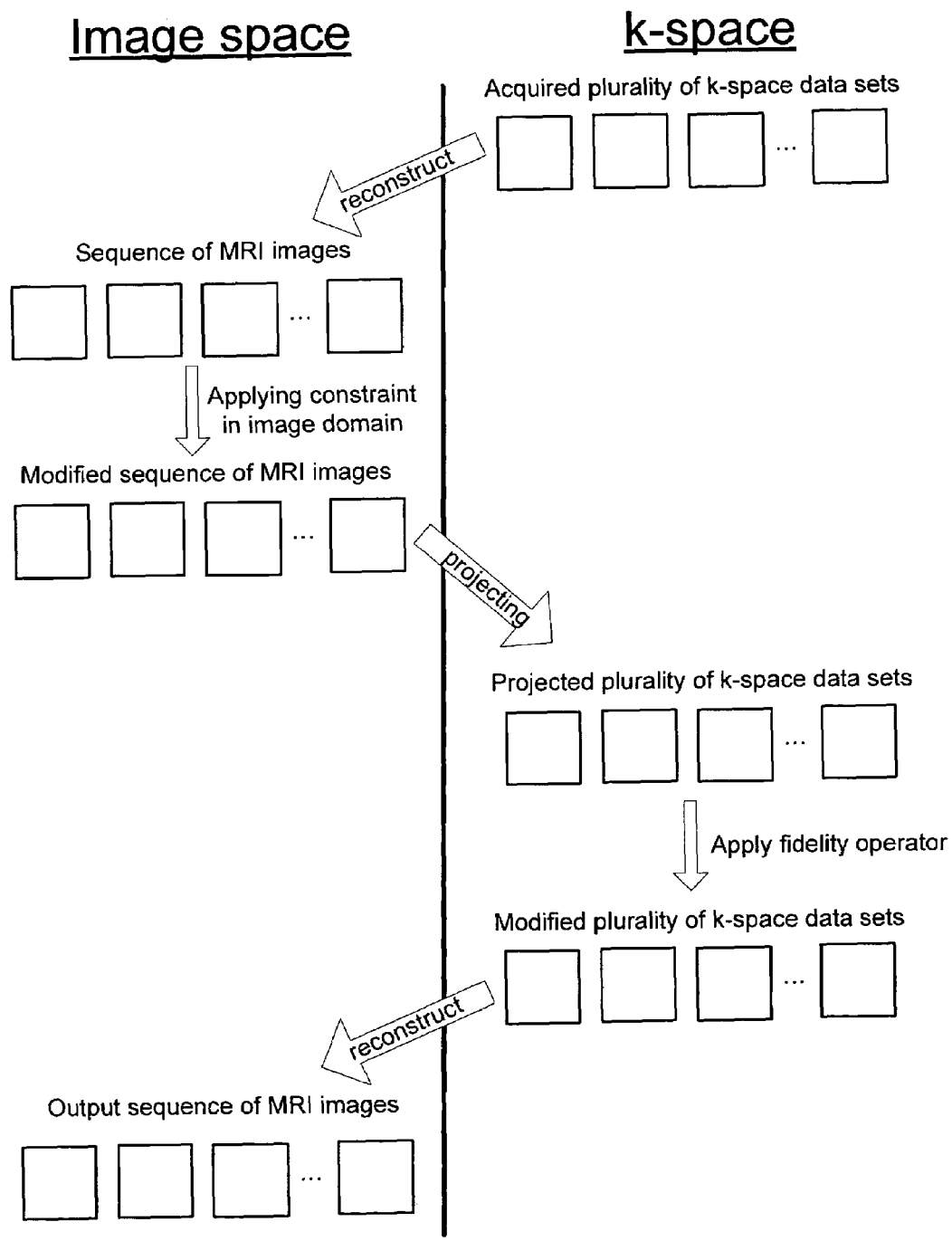

FIG. 8 shows a flowchart with respect to a specific embodiment of the subject invention.

Figure 9:
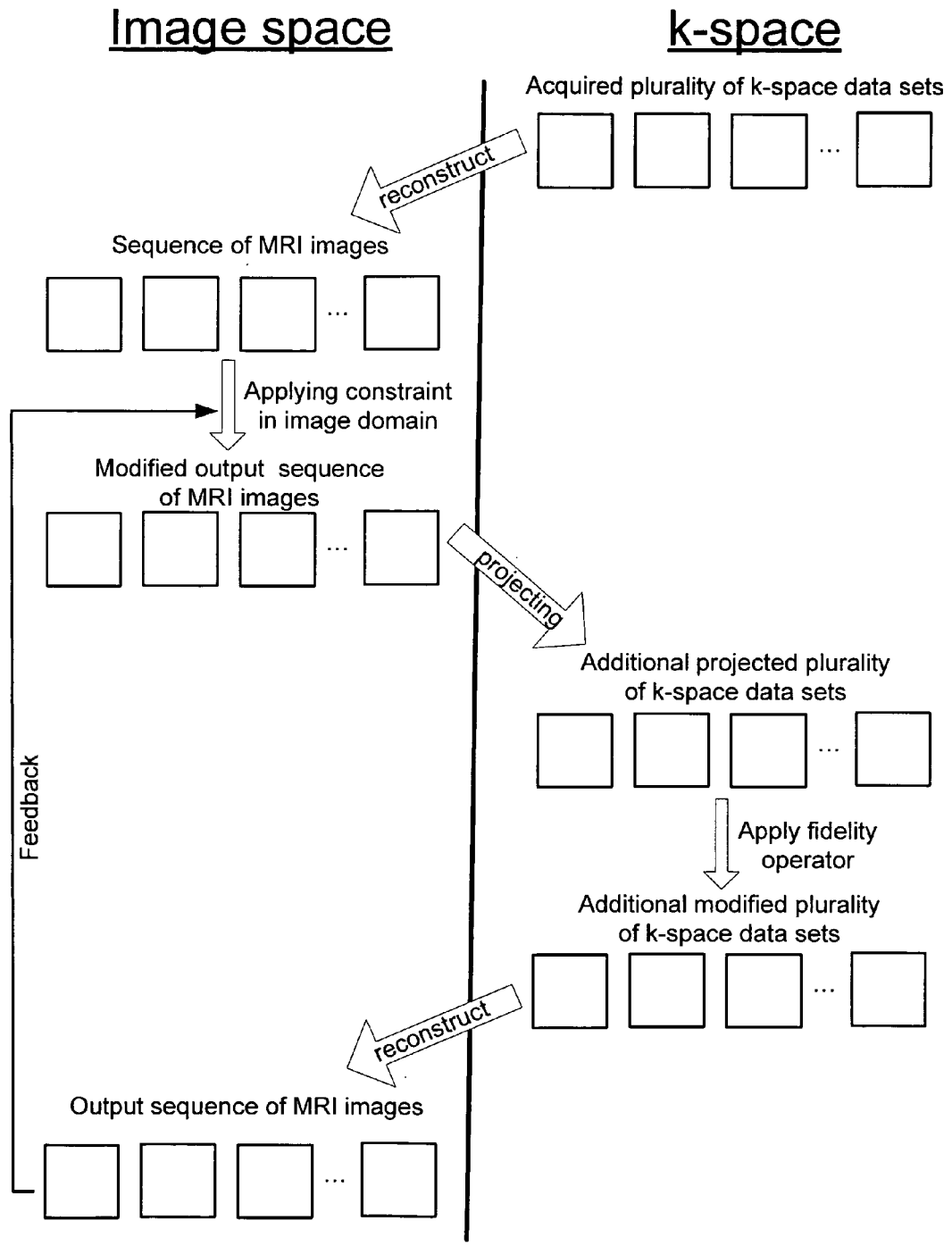

FIG. 9 shows a flowchart with respect to another specific embodiment of the subject invention that adds a feedback loop to the embodiment of FIG. 8.

DETAILED DISCLOSURE OF THE INVENTION

The subject invention pertains to a method and apparatus for acquiring and reconstructing a sequence of magnetic resonance imaging (MRI) images. The subject invention can be advantageously used for acquiring and reconstructing a sequence of time crucial MRI images. The sequence, or set of images may be spread through time, as in an enhancement study or interventional MRI, where some region of the image is changing relatively little through time. Regions of the image changing relatively little with time can be referred to as low dynamic regions and regions of the image changing more can be referred to as high dynamic regions. The set of images may represent periodic motion, as in the phases of a cardiac cycle. Alternatively, a set of 2D images may be stacked, where the images appear similar from slice to slice.

The subject method is useful when short acquisition time is crucial for the MRI. It has advantages when multi-channel coil is available or when a collection of images is to be acquired and the images have some similarity, such as the images representing scenes of the same anatomy at different moments in time or the images representing neighboring slices where structures extend through the neighboring slices. The subject method can be applied when some k-space samples are not acquired, as in partially parallel imaging. The k-space samples which are not acquired can be computed to create a full set of k-space points for each image.

We can present a framework for specific embodiments of the subject invention. Let r and k be the image space and k-space coordinates respectively, $S_i(r)$—i-th channel sensitivity profile, $f(r)$—the image function, $\tilde{K}$—the k-space sampling pattern, $m_i(k)$—data acquired by the i-th coil at k $\in \tilde{K}$. Several operators are defined as follows:

A data fidelity operator $P_F^i$ can ensure the k-space at the sampled position $k \in \tilde{K}$ has the predefined values $m_i(k)$. This operator replaces the data in k-space positions having corresponding acquired k-space data with the corresponding acquired k-space data, so as to protect the fidelity of the acquired data.

$$P_F^i(G(k)) = \begin{cases} m_i(k), & k \in \tilde{K} \\ G(k), & k \notin \tilde{K} \end{cases} \quad [1]$$

Regularization operators $P_{NK}^i$ and $P_{NI}^i$ can regularize the interim k-space ($P_{NK}^i$) and image space ($P_{NI}^i$) based on any available constraints for i-th channel. The definition could be different based on the information available we have. Several examples of such a definition will be given.

Projection back into k-space operator $P_K^i$ can project the image back into k-space for each channel based on the sensitivity maps. Hence $P_K^i = FFT(f(r) \cdot S_i(r))$. The operator '·' means point wise multiplication.

Full k-space reconstruction operator $P_{Rf}$ can reconstruct an image with full k-space. This operator can be any optimized algorithm for phased array, such as sum-of-squares or weighted least square reconstruction.

Partial k-space reconstruction operator $P_{Rp}$ can reconstruct image with partial k-space. This operator can be, for example, either GRAPPA or SENSE, or k-t space reconstruction method.

Let $m_i(k)$ be the raw acquired k-space data, then the reconstructed image in accordance with an embodiment of the subject method can be generated according to the following equation $$f(r) = P_{Rf}(P_{NK}^i(P_F^i(P_K^i(P_{NI}^i(P_{Rp}(m_i(k))))))) \quad [2]$$

where FFT are fast Fourier transform. In equation [2], $P_{Rf}$ and $P_{Rp}$ work on all channels (i=1, 2, ..., N) simultaneously, where N is the number of channels.

For the case that the reconstructed f(r) is not accurate enough, equation [2] can be applied recursively until f(r) is convergent or accurate enough. Determination of whether the reconstructed image is convergent can be made by determining whether application of $P_{NK}^i$ and/or $P_{NI}^i$ operators change the output sequence of image f(r) more than a first threshold and/or a second threshold respectively. Other techniques can also be used to determine whether f(r) is convergent or accurate enough.

POCS with Self-Calibrating SENSE

SENSE is known as a reconstruction method in image space. Accuracy of sensitivity maps is essential for the reconstruction. Wang et al.(24) and McKenzie et al. (25) suggested to use fully-sampled k-space as internal sensitivity references to avoid inaccurate registration of sensitivity maps. However, when the k-space is not equally spaced, a huge linear system may need to be solved for SENSE reconstruction. Hence, SENSE either cannot directly utilize some of the acquired k-space data for reconstruction or cannot avoid computation complexity. In an embodiment of the subject invention, in order to utilize a fully acquired center in k-space, reconstruction can involve projecting the reconstructed image by SENSE back into k-space, and then utilizing all, or a portion of, the acquired data in k-space before reconstructing the final image through any optimized algorithm for phased array coil. Utilizing the acquired data in k-space can be accomplished by replacing k-space data with the acquired k-space data at k-space locations or positions for which there is acquired k-space data. Accordingly, an embodiment of the subject invention can be considered combining POCS with self-calibrating SENSE method.

Modifying equation [2] and using the same notations and definitions, and letting $P_{Rp}$ be self-calibrating SENSE, then this embodiment of the subject method is $$f(r)=P_{Rf}(P_F{}^i(P_K{}^i(P_{Rp}(m_i(k))))) \quad [3]$$

In most cases, no iteration is necessary for this embodiment. Since sensitivity maps have already been generated for SENSE, $P_K{}^i$ can be easily implemented.

POCS with Prior Intensity Information in Dynamic Imaging

Prior-information driven techniques are based on the idea that one should be able to acquire fewer data points given some degree of prior information about the object being imaged. In dynamic imaging, such as Cardiac MRI or Functional MRI, it is often true that the background is slow changing or slow dynamic. The subject method can take advantage of the similarity between the backgrounds of images in dynamic image sequences. The subject method can utilize prior information in image space to calibrate sparse k-space data and thereby improve image quality.

The following implementation can be used as an example. For a set, or sequence, of dynamic images, a full k-space is acquired for the first frame, but only partial k-space is acquired for all other frames. The trajectory of the partial k-space can be arbitrary but have a fully sampled center. For reconstruction, equation [2] is applied. $P_{Rp}$ is defined as zero padding and $P_{Rf}$. The background of the first frame can be used a constraint, such that all other frames has similar background to the first one. If we define $f^{1i}(r)$ to be the first frame image reconstructed from the fully acquired k-space data of i-th channel and D to be the background region, then $$P_{NI}^i(g(r)) = \begin{cases} f^{1i}, & r \in D \\ g, & r \notin D \end{cases} \quad [4]$$

To define $P_K{}^i$, sensitivity map information is necessary when there are multi-channels. The fully sampled central can be used to generate the sensitivity maps. Then the subject model is $$f_{n+1}(r)=P_{Rf}(P_F{}^i(P_K{}^i(P_{NI}{}^i(f_n(r)\cdot S_i(r))))), f_0(r)=P_{Rp}(m_i(k)) \quad [5]$$

where n is for iteration.

The subject method can be applied with or without the use of multiple receiver channels. In a specific embodiment, information from separate receiver channels can be used to help determine unsampled k-space points. In such an embodiment using separate receiver channels, a real-space subset of pixels can be used to write equations to fill in unsampled k-space points.

In a specific embodiment, the subject invention can be used for reconstruction of Dynamic MRI with arbitrary under-sampled k-space trajectories. A full (satisfy Nyquist limit) k-space pre-scan can be taken to get a high-quality image and choose the static area of the reconstructed image. By taking advantage of similarity of background of dynamic image, the subject method can iteratively calibrate the sparse k-space data according to the prior background information and can result in a full Cartesian k-space. The Full Cartesian k-spaces can be easily applied to generate high quality images. Numerical studies have been performed with data from different systems, and different types of k-space. The subject method works well for arbitrary under-sampled k-space trajectories and/or an arbitrary number of probe coils. In a specific embodiment, the reconstruction speed can be 60 times faster than Non-Cartesian SENSE. The subject method can be applied to a more general k-space than GRAPPA.

In a specific embodiment, to get the background information for the sequence of dynamic images a pre-scan can first be taken to get a an image $I_1$. Preferably, the prescan is a full k-space pre-scan so as to produce a high-quality image $I_1$. In a specific embodiment, the pre-scan can be taken so as to satisfy the Nyquist limit in K-space. Then the static part of the high-quality image can be set as the background b, where $I_{1b}$ is the data of $I_1$ at b. For all other time sequences for the same slice, k-space can be sparse and of any type. Likewise, for neighboring slices of a set of 2D stacked images, k-space can be sparse and of any type. Let $K_i$ be the k-space scanned for the $i^{th}$ image, $D_i$ is the set of positions where $K_i$ has value. Let $K_i{}^t$ be the true Full Cartesian k-space for the $i^{th}$ image and $I_i{}^t$ be the true $i^{th}$ image that is unknown. The subject method can now approximate $K_i{}^t$ by using $I_{1b}$ and $K_i$.

Under-Sampled Cartesian K-Space

With respect to an embodiment of the subject invention, under-sampled Cartesian k-space can be considered. A specific embodiment of the subject method for any k-space will then be introduced.

For simplicity, assume $K_i$ is an under-sampled Cartesian k-space. Let $K_i{}^n$, n=1,2,3 . . . , be the $n^{th}$ iteration approximation for $K_i$, $I_i{}^n$ be the correspondence image, and $I_{ib}{}^n$ be the data of $I_i{}^n$ at b. So $$K_i{}^t - K_i{}^n = FFT(I_i{}^t - I_i{}^n) \quad (1)$$

Where FFT refers to Fast Fourier Transform operator. It follows that $$K_i{}^t = FFT(I_i{}^t - I_i{}^n) + K_i{}^n \quad (2)$$

Because $I_i{}^t$ is unknown, equation (2) cannot be applied directly to get $K_i{}^t$. Fortunately, at the background area b, $I_i{}^t$ should be very similar as $I_{1b}$, hence $I_{1b}$ can be used to approximate $I_i{}^t$ at b. Hence we change equation (2) to be $$K_i{}^{n+1} = FFT(I_{1b} - I_{ib}{}^n) + K_i{}^n \quad (3)$$

It is natural to keep the scanned data unchanged. So we add one constrain for (3)

$$K_i{}^{n+1}(D_i) = K_i(D_i) \quad (4)$$

To get the initial value to start the iteration, we can define $$K_i^1 = \begin{cases} K_i, & D_i \\ 0, & \text{other} \end{cases} \quad (5)$$

Figure 1:
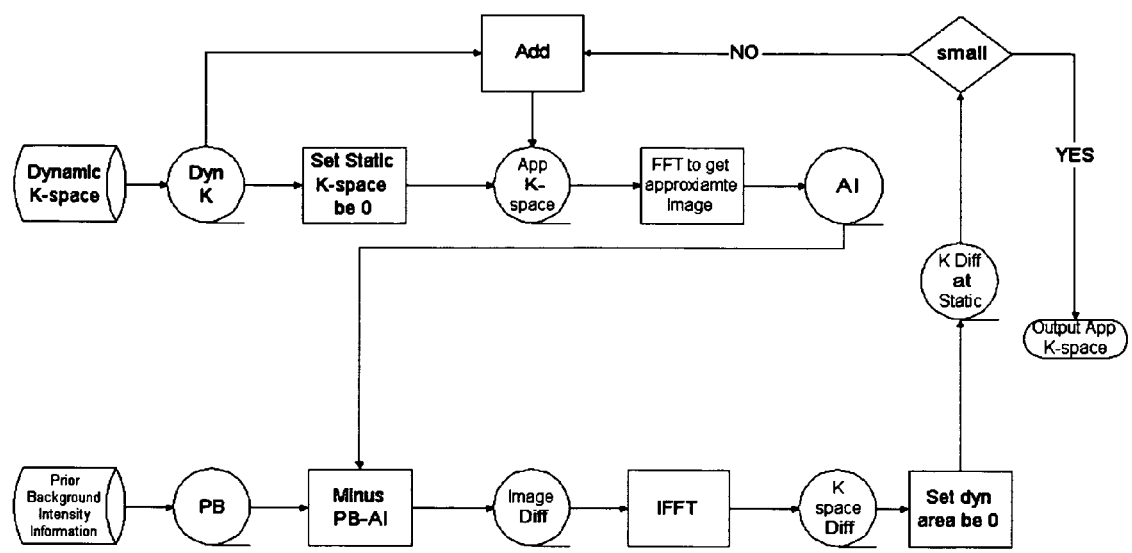
FIG. 1 shows a flow chart of a specific embodiment of the subject invention for performing fast reconstruction with prior information of dynamic MRI.

Combining equations (3–5), the flow chart in FIG. 1 demonstrates a specific embodiment of the subject method.

We can define $e_i{}^n = K_i{}^t - K_i{}^{n+1}$, which is the error of $n^{th}$ iteration. Let d be the dynamic area of image, which is the whole image domain minus b. According to equation (3), $$e_i{}^n = K_i{}^t - K_i{}^n - FFT(I_{1b} - I_{ib}{}^n) = e_i{}^{n-1} - FFT(I_{1b} - I_{ib}{}^n) \quad (6)$$

We can define $eI_{ib}=I_{ib}-I_{1b}$, then $$FFT(I_{1b} - I_{ib}^n) = FFT(I_{ib} - eI_{ib} - I_{ib}^n) \quad (7)$$
$$= FFT((IFFT(K_i^t - K_i^n))_b - eI_{ib})$$
$$= FFT((IFFT(K_i^t - K_i^n)) -$$
$$(IFFT(K_i^t - K_i^n))_d - eI_{ib})$$
$$= e_i^{n-1} - FFT((IFFT(K_i^t - K_i^n))_d - eI_{ib})$$

Hence, with consideration of the constraint of equation (4)

$$e_i^n = \begin{cases} 0, & D_i \\ FFT((IFFT(e_i^{n-1}))_d + eI_{ib}, & \text{others} \end{cases} \quad (8)$$

The convergence of this algorithm can be decided by equation (8). If the norm of the operator $FFT((IFFT(e))_d)$, where $e=0$ at $D_i$, is less than 1, then the iteration result will be convergent to $FFT(eI_{ib})$ in K-space other than $D_i$. Therefore the convergence can be decided by the choice of $D_i$ and b. If the algorithm is convergent, then the error is decided by $D_i$ and $eI_{ib}$.

From the definition of the operator, it is preferred that the scanned part of k-space has less energy difference than the full K-space, i.e., the scanned part should be at the center of k-space. Also the background of the sequence of images preferably will not change much.

Figure 2A:
FIG. 2A shows the equally spaced K-space with extra lines in the middle, where red lines show where the K-space is known.
Figure 2B:
FIG. 2B shows the center plate K-space, where red shows where the K-space is known.
Figure 2C:
FIG. 2C shows the rings with center plate K-space, where red shows where the K-space is known.
Figure 2D:
FIG. 2D shows the linearly spaced K-space, where the distance between scanned lines in the center is smaller than the distance between scanned lines away from the center.
Figure 3A:
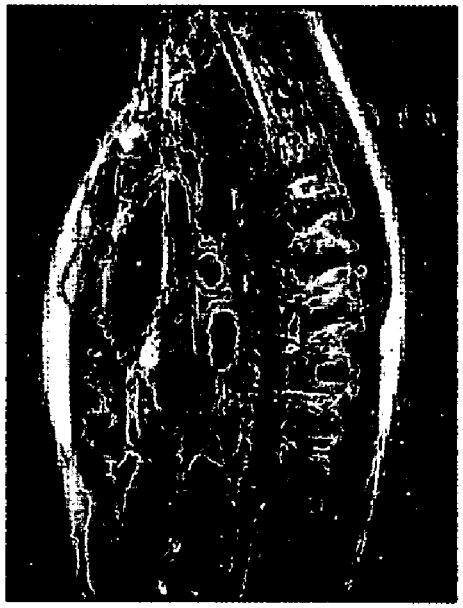
FIGS. 3A–3D show the results for cardiac images collected by a 1.5 T GE system through fast imaging employing steady-state acquisition (FIESTA) with GE 4-channel cardiac coil.
Figure 3B:
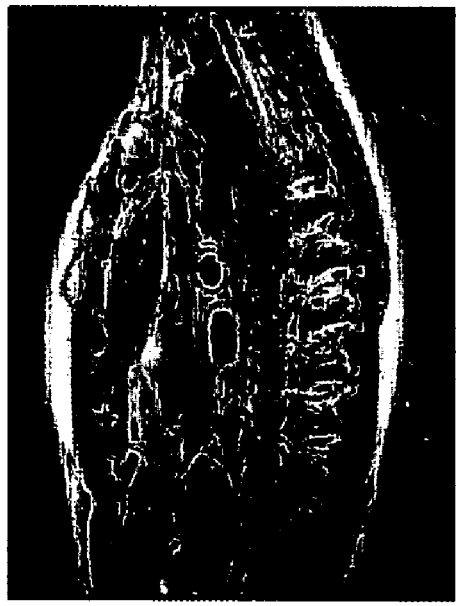
Figure 3C:
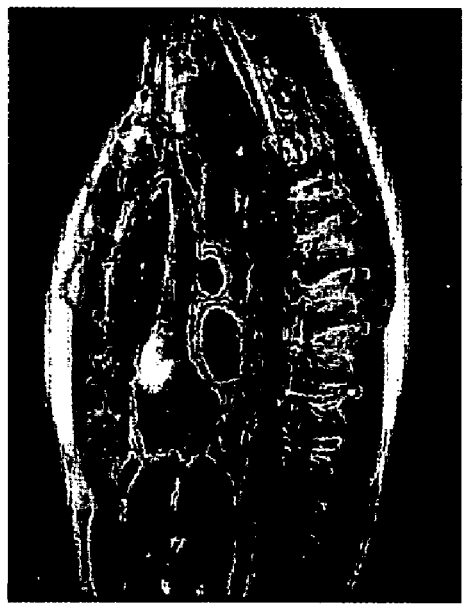
Figure 3D:

The specific embodiment of the subject method shown in FIG. 1 was applied on reconstruction of Cardiac MR images and functional MR images. In all of these experiments, only the first image has the full K-space to get the background information. Let the phrase "intensity difference" refer to the difference in magnitudes between the reconstructed and reference-images at each pixel. We can define the "ghost ratio" as the magnitude of the "intensity difference" (at each pixel) summed over every pixel in the image divided by the sum of the absolute values of each pixel in the reference image. The "ghost ratio" is actually the relative error. The "reduce ratio" of k-space can refer to the ratio of scanned part over the Full K-space domain. The "background ratio" can refer to the ratio of background over the whole image domain. To test the stability of the proposed method, both sparse Cartesian K-space and sparse Non-Cartesian k-space were tested. FIGS. 2A–2D show the definition of some specific K-types, which represent some of the different types of sparse Cartesian k-space. The red lines show where the K-space is known. FIG. 2A shows equally spaced k-space with extra lines in the middle, which is often used by GRAPPA. FIG. 2B shows center plate. FIG. 2C shows rings with center plate. FIG. 2D shows linearly spaced k-space, which means the distance between scanned lines in the center is smaller than that of outside.

To compare the results of the specific embodiment of the subject method as shown in FIG. 1 and the results of GRAPPA, sliding block GRAPPA (26) was applied in each experiment. In the sliding block GRAPPA, 3 different blocks (up 2 & down 2, up 1 & down 3, up 3 & down 1) were used to generate 3 possible reconstructions for each line. These lines were then combined in a weighted average to form the final reconstructed line. For simplicity, the same weight was used in these experiments.

In each experiment, MATLAB codes were run on a COMPAQ PC with a 1 G Hz CPU and 1 G RAM.

Cardiac Images

Table 1 and FIG. 3 show the results for Cardiac Images collected by a 1.5 T GE system (FOV 280 mm, matrix 256×192, TR 4.510 ms, TE 2.204 ms, flip angle 45°, Slice thickness 6 mm, number of averages 2) through Fast Imaging Employing Steady-State Acquisition (FIESTA) with a GE 4-channel cardiac coil. Breath-holds ranged from 10–20 seconds. There are 20 images per heartbeat. For reconstruction, only the 1st image used the full k-space. Reconstruction for all other images uses the background information of the first image and partial k-space.

TABLE 1

Average Ghost Ratio of Dynamic Cardiac MR Images

| K_type | Reduce ratio | background ratio | Ghost ratio by the subject invention | Ghost ratio by GRAPPA |
| --- | --- | --- | --- | --- |
| a | 50% | 82.56% | 8.07% | Did not work |
| a | 56.25% | 85.84% | 6.26% | 4.54% |
| c | 25.51% | 86.19% | 7.28% | Did not work |
| c | 45.14% | 84.36% | 5.90% | Did not work |
| d | 48.44% | 87.01% | 6.33% | Did not work |
| d | 52.73% | 86.19% | 6.00% | Did not work |

FIG. 3 shows results from the utilization of a specific embodiment of the subject invention as shown in FIG. 1. To reconstruct the images, k-space type was selected to be center-rings, the k-space ratio was 25.51% and the background ratio was 86.19%. The reference images were reconstructed with full k-space. All images used the same gray scale. Two reconstructed images are compared with the reference images in FIG. 3. One reconstructed image (FIG. 3B) has the smallest ghost ratio 5.08% among all 19 reconstructed images with partial k-space, the other one (FIG. 3D) has the biggest ghost ratio among all 19 reconstructed images with partial k-space. Even with only 25.51% k-space, the worst reconstructed image has no extinct ghost.

Table 1 shows the average ghost ratios of all 20 images reconstructed with different k-space type and ratio. GRAPPA only works for k-space with equal spacing. In the case GRAPPA worked, the time consumed for all 20 images by sliding block GRAPPA was 59.39 seconds with ghost ratio 4.54%. With the same data, the time consumed for all 20 images by the specific embodiment of the subject invention illustrated in FIG. 1 was 39.24 seconds with ghost ratio 6.26%. For this kind of k-space, GRAPPA is better than this embodiment of the subject invention, because some missing lines in k-space have high energy and those high-energy missing lines influence the convergence speed of the subject method. The subject method works very well for k-space with known center plate or center rings. In that case, the subject method can reconstruct high quality images with only 25.51% k-space.

Again, to summarize some of the characteristics and advantages one or more specific embodiments of the subject method can have: the subject method can be applied for any kind of k-space the subject method can work faster than other known methods for non-Cartesian k-space, which often require minutes; the subject method can be utilized with different prior information; the subject method performs better with rings (k-space) than rows (equally space or linearly spaced K-space); and for equally spaced k-space data without any prior intensity information, GRAPPA or more general linear interpolation in k-space may be preferred if no sensitivity map information is available, and SENSE may be preferred if accurate sensitivity map is available. If prior intensity is known, the subject method can be applied to each channel separately, thus allowing for parallel computing. Accordingly, the subject method can be applied in real time.

The subject method can be combined with parallel imaging techniques to improve reconstruction quality. For example, the dynamic k-space area can be equally spaced scanned with several extra ACS lines. GRAPPA or autocalibrated linear interpolation in k-space can then be applied to interpolate the missing lines before applying the subject method to reconstruct the image(s).

If the k-space data samples are not on a Cartesian grid, the so-called 'Iterative Next Neighbor re-Gridding (INNG) algorithm'(Moriguchi, H., S. L. Lewin, J. L. Duerk (2003) "A New Approach for Optimal Reconstruction Using Rescaled Matrices from Non-Uniformly Sampled k-space Data", Vancouver, *Proc. Intl. Soc. Mag. Reson. Med.* 11: 1066)can be applied here to use the subject invention. INNG avoids the complexity of gridding.

POCS with SENSE for Dynamic Imaging

In embodiments with more than one channel, the subject method can be easily combined with a parallel imaging technique to reduce the necessary acquisition and/or improve the image quality. One easy way is just change $P_{Rp}$ to be a parallel imaging operator. Another way to combine with GRAPPA is to acquire variational density k-space, and apply GRAPPA to partially interpolate the k-space and then use the subject method to interpolate the other k-space. For example, if the number of phase encoding lines is 256, the reduction factor can be set to be 1 for the central 10 lines [123–132], which will be used as Auto Calibration Signal ACS lines. Then the reduction factor can be set to be 2 for [73 122] and [133 182]. And the reduction factor is 4 for other places. For reconstruction, GRAPPA can be applied to generate fully sampled k-space at lines [73 182], and then apply equation [5] to reconstruct the image.

In this embodiment, SENSE can be modified. In conventional SENSE, a linear system is solved to unwrap the folded image. Suppose the number of channels is $N_C$ and the reduction factor is R. Then a linear system, which has $N_C$ unknowns and R unknowns, needs to be solved to unwrap one pixel on the folded image. However, if some prior intensity information is available, then the number of unknowns can be reduced in the system, and hence reduce the requirement of number of equations or the g-factor. Consequently, the requirement of acquisition can be reduced or the SNR can be improved. For dynamic imaging, it is possible to generate this kind of prior intensity information as described in the previous section. Again, a fully sampled center is necessary for sensitivity maps and higher SNR. This scheme is called SENSE for dynamic imaging. Let $P_{Rp}$ be the so called SENSE for dynamic imaging, the subject method can be formulated as $$f(r) \times P_{Rf}(P_F^i(P_K^i(P_{Rp}(m_i(k))))) \quad [6]$$

POCS for Parallel Imaging with Multitudinous Channels

To improve image quality, a multi-channel coil is available now, such as a 32 channel cardiac coil (MRI Devices Corporation, Waukesha, Wis.) can be utilized. However, when the number of channels is large, reconstruction time for parallel imaging can be considerable. One way to address this problem is to compress the data into a fewer number of channels and then reconstruct the image. In many cases, some information can be lost in the step of data compression. In an embodiment of the subject invention, allowing utilization of all of the acquired data, the reconstructed image with compressed data can be projected back into the original uncompressed k-space and then another image can be reconstructed by an algorithm for phased array coils after the acquired k-space data is used to replace k-space values at the corresponding k-space data. Preferably, such an algorithm for phased array coils can be optimized. A fully sampled center is preferred, and sometimes necessary, for sensitivity maps and higher SNR. Let $P_{Rp}$ be a parallel imaging operator, $\hat{m}_j(k)$ be the compressed data and notice that $P_K^i$ and $P_F^i$ are for the original uncompressed data, then this embodiment can be formulated as $$f(r) = P_{Rf}(P_F^i(P_K^i(P_{Rp}(m_i(k)))))$$

Since only fast Fourier transform is used in this operation, combination with POCS will not increase the reconstruction time much but can dramatically improve the image quality.

EXAMPLE 1

An important idea in k-t SENSE [27] is to minimize the support of the image in x-f space and, hence, improve the reconstruction performance. In an embodiment of the subject invention, this idea can be utilized in k-t space and used by k-t GRAPPA[28]. For a sequence of k-space data set for a dynamic subject, the mean of k-space along time direction can be produced. A new sequence of k-space data sets can be generated by the subtraction from original k-space of the mean of k-space. It is often true for dynamic images that the new sequence of k-space data sets corresponds to images that have reduced support. So this k-space can be better for parallel imaging techniques. In a specific embodiment, k-t GRAPPA can generate better results with the residue sequence of k-space data sets, or, in other words, the sequence of k-space data sets where the data sets are the original data minus the mean of the data sequence at that position in k-space. Experiments on Cardiac MRI with different coils show the advantage of this embodiment.

Method

As a specific embodiment, the k-t space acquisition scheme described in [28] is applied here. The first step is to generate the average k-space. For this time-interleaved k-space, we simply add them together along the time direction and then divide the summation by the number of acquisitions at that k-space position. Then the residue k-t space is calculated as the subtraction of the mean k-space value from each k-space data value. k-t GRAPPA is applied to the residue k-t space. Last, the summation of the result of k-t GRAPPA and the mean k-space make the reconstructed full k-t space. Sum of squares can be used to reconstruct the final image sequence by using the full k-t space.

Results

Three sets of data corresponding to coil systems having a different number of coils were used for experiments with a different number of channels. Two sets of cardiac images were collected by a SIEMENS Avanto system (FOV 340× 255 mm, matrix 384×150, TR 20.02 ms, TE 1.43 ms, flip angle 46°, Slice thickness 6 mm, number of averages 1) through cine true FISP with both 32 channels cardiac coil (MRI Devices Corporation, Waukesha, Wis., USA) and 12 channels TIM cardiac coil (SIEMENS). There are 12 images per heartbeat. There is no abrupt motion among those images. One set of cardiac Images was collected by a 3T SIEMENS system through Turbo FLASH SR with a SIEMENS 8-channel cardiac coil. There are 70 images in this sequence. There are a couple of motions in those images. To get the relative error, pseudo-partial k-space was used. This means that the reduction factor is 1 for acquisition but only a quarter of phase encoding lines with 6 fully sampled lines in the center of k-space were used for reconstruction. The relative error is defined as the relative difference of the energy between the reference image and the reconstructed image divided by the energy of the reference image. The numbers given in Table 2 are the mean of relative errors over each time frame. The dynamic region is defined as the region around the heart. FIGS. 5A and 5B show the relative errors of each image with a smoothly changing image sequence. One line is for k-t GRAPPA, and the other line is for modified k-t GRAPPA. FIG. 5C shows the results for an image sequence with abrupt motion. Because of the motion, it is difficult to define the dynamic region. Hence the relative error is for the whole image. It can be seen that modified k-t GRAPPA works robustly in the motion case. The mean relative error of modified k-t GRAPPA is 11.69%. The mean relative error of k-t GRAPPA is 12.37%.

TABLE 2 mean relative errors or various methods at different region

| #channel | k-t GRAPPA | | Modified k-t GRAPPA | |
|---|---|---|---|---|
| | dynamic | whole | dynamic | whole |
| 32 | 7.75% | 4.79% | 7.38% | 4.19% |
| 12 | 9.06% | 5.85% | 7.83% | 5.6% |

From these experiments we can see that the residue k-space can be used by k-t GRAPPA to improve the reconstruction performance. The reason is that the energy in the residue k-space is not dominated by the centeral lines, hence the calculated weights are more suitable for high frequency k-space region. The modified k-t GRAPPA, like conventional k-t GRAPPA, works robustly for images with sharp motions. The residue k-space can also be utilized by other parallel imaging techniques.

The invention claimed is:

1. A method for producing a sequence of magnetic resonance imaging (MRI) images, comprising:
   a. acquiring an acquired plurality of k-space data sets, wherein the acquired plurality of k-space data sets are acquired during a corresponding plurality of MRI scans taken over a corresponding plurality of time periods;
   b. reconstructing a sequence of MRI images from the acquired plurality of k-space data sets, wherein each MRI image of the sequence of MRI images is reconstructed from a corresponding k-space data set of the plurality of k-space data sets;
   c. applying a constraint to the sequence of MRI images in the image domain, wherein the constraint is applied to a portion of each MRI image that is slow-moving, wherein application of the constraint to the sequence of MRI images in the image domain modifies the sequence of MRI images;
   d. projecting each of the modified sequence of MRI images into k-space to create a projected plurality of k-space data sets;
   e. applying a fidelity operator to the projected plurality of k-space data sets, wherein the fidelity operator replaces at least a portion of the k-space data in the k-space data sets of the projected plurality of k-space data sets with the corresponding k-space data from the acquired plurality of k-space data sets, wherein the replacement of at least a portion of the k-space data in the projected plurality of k-space data sets further modifies the projected plurality of k-space data sets; and
   f. reconstructing an output sequence of MRI images from the modified projected plurality of k-space data sets.

2. The method according to claim 1, further comprising: applying a second constraint to the modified plurality of k-space data sets in k-space, wherein application of the second constraint to the modified plurality of k-space data sets in k-space further modifies the modified plurality of k-space data sets.

3. The method according to claim 2, wherein the second constraint is a low-pass filter.

4. The method according to claim 1, further comprising:
   g. applying the constraint to the output sequence of MRI images in the image domain, wherein the constraint is applied to a portion of each MRI image that is slow-moving, wherein application of the constraint to the output sequence of MRI images in the image domain modifies the output sequence of images;
   h. projecting each of the modified output sequence of MRI images into k-space to create an additional projected plurality of k-space data sets;
   i. applying the fidelity operator to the additional projected plurality of k-space data sets, wherein the fidelity operator replaces at least a portion of the k-space data in the k-space data sets of the additional projected plurality of k-space data set with the corresponding k-space data from the acquired plurality of k-space data sets, where the replacement of at least a portion of the k-space data in the additional projected plurality of k-space data sets modifies the additional projected plurality of k-space data sets;
   j. reconstructing the output sequence of MRI images from the modified additional projected plurality of k-space data sets.

5. The method according to claim 4, further comprising: repeating the steps g, h, i, and j until the output sequence of images are convergent.

6. The method according to claim 5, wherein the output sequence of images are convergent when the step of applying the constraint to the output sequence of images does not change the output sequence of images more than a first threshold amount.

7. The method according to claim 5, wherein the output sequence of images are convergent when the step of applying the fidelity operator to the additional projected plurality set of k-space data sets does not change the additional projected plurality of k-space data sets more than a second threshold amount.

8. The method according to claim 1, wherein the fidelity operator replaces the k-space data in the k-space data sets of the modified plurality of k-space data sets having corresponding k-space data in the acquired plurality of k-space data sets with the corresponding k-space data in the acquired plurality of k-space data sets.

9. The method according to claim 1, further comprising: acquiring an additional acquired k-space data set, wherein the additional acquired k-space data set is acquired during a corresponding additional MRI scan taken over a corresponding additional time period, wherein the additional acquired k-space data set is more complete than each of the acquired k-space data sets of the acquired plurality of k-space data sets, wherein the constraint is derived from the additional acquired k-space data set.

10. The method according to claim 9, further comprising:
reconstructing an additional MRI image from the additional acquired k-space data set, wherein applying the constraint comprises setting a portion of each MRI image of the sequence of MRI images that is low-moving equal to a corresponding portion of the additional MRI image reconstructed from the additional acquired k-space data set.

11. The method according to claim 1, further comprising:
prior to step c, segmenting each MRI image in the sequence of MRI images into a slow-moving portion of the MRI image and a fast-moving portion of the MRI image.

12. The method according to claim 10, further comprising:
prior to step c, segmenting each MRI image in the sequence of MRI images into slow-moving portion of the MRI image and fast-moving portion of the MRI image.

13. The method according to claim 11,
wherein segmenting each image into a slow-moving portion of the MRI image and a fast-moving port of the MRI image comprises calculating a variance of the values of each pixel location from the sequence of MRI images reconstructed from the acquired plurality of k-space data sets and assigning each pixel having a variance below a threshold value to the slow-moving portion of the MRI image and assigning each pixel having a variance above the threshold value to the fast-moving port of the MRI image.

14. The method according to claim 11,
wherein segmenting each MRI image in the sequence of MRI into a slow-moving portion of the MRI image and a fast-moving portion of the MRI image comprises a user selecting the slow-moving portion of the MRI image and the fast-moving port of the MRI image.

15. The method according to claim 1,
wherein each of the k-space data sets of the acquired plurality of k-space data sets acquired during one of the corresponding plurality of MRI scans comprises at least two k-space data sets, wherein each of the at least two k-space data sets are acquired by one of a corresponding at least two channels of a MRI system used to acquire the acquired plurality of k-space data sets.

16. The method according to claim 15,
wherein reconstructing a sequence of MRI images and reconstructing an output sequence of MRI images comprises reconstructing a sequence of MRI images via a parallel imaging technique and reconstructing an output sequence of MRI images via the parallel imaging technique.

17. The method according to claim 16,
wherein the parallel imaging technique is GRAPPA.

18. The method according to claim 16,
wherein the parallel imaging technique is SENSE.

19. The method according to claim 1,
wherein reconstructing a sequence of MRI images and reconstructing an output sequence of MRI images comprises reconstructing a sequence of MRI images via a non-parallel imaging technique and reconstructing an output sequence of MRI images via the non-parallel imaging technique.

20. The method according to claim 19,
wherein the non-parallel imaging technique is k-t GAAPPA.

21. The method according to claim 19,
wherein the non-parallel imaging technique is k-t BLAST.

22. The method according to claim 19,
wherein the non-parallel imaging technique is UNFOLD.

23. The method according to claim 20,
wherein the non-parallel imaging technique is SLIDING WINDOW.

* * * * *

UNITED STATES PATENT AND TRADEMARK OFFICE
CERTIFICATE OF CORRECTION

PATENT NO. : 7,202,663 B2
APPLICATION NO. : 10/987038
DATED : April 10, 2007
INVENTOR(S) : Feng Huang It is certified that error appears in the above-identified patent and that said Letters Patent is hereby corrected as shown below:

Column 7,
Line 5, "k-t GAAPPA" should read --k-t GRAPPA--.

Column 8,
Lines 14-15, "more flexible then prior techniques" should read
--more flexible than prior techniques--.
Line 56, "generate high quality images" should read
--generate high quality images.--.

Column 12,
Line 10, "$P_{NK}{}^i$ and $P_{NI}{}^i$" should read -- $P^i_{NK}$ and $P^i_{NI}$ --.

Line 11, "$(P_{NK}{}^i)$ and image space $(P_{NI}{}^i)$" should read -- $(P^i_{NK})$ and image space $(P^i_{NI})$ --.

Line 15, "$P_K{}^i$" should read -- $P^i_K$ --.

Line 17, "Hence $P_K{}^i$" should read --Hence $P^i_K$ --.

Line 32, " $f(r) = P_{Rf}(P_{NK}{}^i(P_F{}^i(P_K{}^i\ P_{NI}{}^i(P_{Rp}(m_i(k))))))$ " should read -- $f(r) = P_{Rf}\left(P^i_{NK}\left(P^i_F\left(P^i_K\left(P^i_{NI}\left(P_{Rp}(m_i(k))\right)\right)\right)\right)\right)$ --.

Line 42, "$P_{NK}{}^i$ and/or $P_{NI}{}^i$" should read -- $P^i_{NK}$ and/or $P^i_{NI}$ --.

UNITED STATES PATENT AND TRADEMARK OFFICE
CERTIFICATE OF CORRECTION

PATENT NO. : 7,202,663 B2
APPLICATION NO. : 10/987038
DATED : April 10, 2007
INVENTOR(S) : Feng Huang It is certified that error appears in the above-identified patent and that said Letters Patent is hereby corrected as shown below:

Column 13,

Line 7, " $f(r) = P_{Rf}(P_F{}^i(P_K{}^i(P_{Rp}(m_i(k)))))$ " should read $$-- f(r) = P_{Rf}\left(P_F^i\left(P_K^i\left(P_{Rp}(m_i(k))\right)\right)\right) --.$$

Line 11, "$P_K{}^i$" should read -- $P_K^i$ --.

Line 40, "$P_K{}^i$" should read -- $P_K^i$ --.

Line 45, " $f_{n+1}(r) = P_{Rf}(P_F{}^i(P_K{}^i P_{NI}{}^i(f_n(r) \cdot S_i(r)))))$ " should read $$-- f_{n+1}(r) = P_{Rf}\left(P_F^i\left(P_K^i\left(P_{NI}^i\left(f_n(r) \cdot S_i(r)\right)\right)\right)\right) --.$$

Column 14,
Line 9, "get a an image" should read --get an image--.
Line 9, "the prescan is" should read --the pre-scan is--.

Line 32, "$I_{ib}{}^n$" should read -- $I_{ib}^n$ --.

Column 17,

Line 57, " $f(r) \times P_{Rf}(P_F{}^i(P_K{}^i\ P_{Rp}(m_i(k)))))$ " should read $$-- f(r) = P_{Rf}\left(P_F^i\left(P_K^i\left(P_{Rp}(m_i(k))\right)\right)\right) --.$$

UNITED STATES PATENT AND TRADEMARK OFFICE
CERTIFICATE OF CORRECTION

PATENT NO. : 7,202,663 B2
APPLICATION NO. : 10/987038
DATED : April 10, 2007
INVENTOR(S) : Feng Huang It is certified that error appears in the above-identified patent and that said Letters Patent is hereby corrected as shown below:

Column 18,

Line 11, "$P_K{}^i$ and $P_F{}^i$" should read -- $P_K^i$ and $P_F^i$ --.

Line 14, " $f(r) = P_{Rf}(P_F{}'(P_K{}^i(P_{Rp}(m_i(k)))))$ " should read

-- $f(r) = P_{Rf}\left(P_F^i\left(P_K^i\left(P_{Rp}(m_i(k))\right)\right)\right)$ --.

Column 19,
Line 34, "by the centeral lines" should read --by the central lines--.

Column 21,
Line 23, "a fast-moving port" should read --a fast-moving portion--.
Lines 30-31, "the fast-moving port" should read --the fast-moving portion--.
Line 37, "the fast-moving port" should read --the fast-moving portion--.

Signed and Sealed this

Twelfth Day of August, 2008

JON W. DUDAS
*Director of the United States Patent and Trademark Office*